United States Patent
Lababidi et al.

(10) Patent No.: US 9,300,273 B2
(45) Date of Patent: Mar. 29, 2016

(54) ACTIVE BAND STOP FILTER

(75) Inventors: Raafat Lababidi, Brest (FR); Julien Lintignat, Limoges (FR); Dominique Lo Hine Tong, Rennes (FR); All Louzir, Rennes (FR); Bruno Barelaud, Isle (FR); Bernard Jarry, Chaleix (FR)

(73) Assignee: Thomson Licensing, Issy-les-Moulineaux (FR)

( * ) Notice: Subject to any disclaimer, the term of this patent is extended or adjusted under 35 U.S.C. 154(b) by 4 days.

(21) Appl. No.: 13/994,241

(22) PCT Filed: Mar. 11, 2011

(86) PCT No.: PCT/EP2011/053684
§ 371 (c)(1),
(2), (4) Date: Jun. 14, 2013

(87) PCT Pub. No.: WO2012/079777
PCT Pub. Date: Jun. 21, 2012

(65) Prior Publication Data
US 2013/0293321 A1    Nov. 7, 2013

(30) Foreign Application Priority Data
Dec. 16, 2010    (EP) .................................. 10195414

(51) Int. Cl.
*H03K 5/00*    (2006.01)
*H03H 11/04*    (2006.01)
*H01P 1/203*    (2006.01)

(52) U.S. Cl.
CPC ............. *H03H 11/04* (2013.01); *H01P 1/2039* (2013.01)

(58) Field of Classification Search
CPC ....................................................... H03H 9/64
USPC ................... 333/165–173, 204, 195, 132; 327/552–559; 17/165–173
See application file for complete search history.

(56) References Cited

U.S. PATENT DOCUMENTS

| | | | |
|---|---|---|---|
| 3,593,225 A * | 7/1971 | Fisher | 333/205 |
| 3,974,399 A * | 8/1976 | Oyama et al. | 327/555 |
| 4,733,209 A | 3/1988 | Paynting | |
| 6,037,848 A * | 3/2000 | Alila et al. | 333/202 |

(Continued)

FOREIGN PATENT DOCUMENTS

| | | |
|---|---|---|
| EP | 1898486 | 3/2008 |
| JP | S5074834 | 6/1975 |

(Continued)

OTHER PUBLICATIONS

Ki-Byoung Kim et al: "Application of RF varactor using Ba x Sr 1-x Ti0 3 /Ti0 2 /Hr-Si substrate for reconfigurable radio", vol. 54, No. 11, Nov. 2007, IEEE Transactions on Ultrasonics, Ferroelectrics and Frequency Control.

(Continued)

*Primary Examiner* — Dinh Le
(74) *Attorney, Agent, or Firm* — Myers Wolin LLC

(57) ABSTRACT

The present invention relates to an active band stop filter comprising a filter input and a filter output which are linked by a transmission line LT, a resonator RE coupled to the transmission line and connectable to a load impedance. Between the resonator and the load impedance there is mounted a means of activation of the filtering function in a chosen operating band. The filter is useable in multistandard terminals.

3 Claims, 4 Drawing Sheets

(56) References Cited

U.S. PATENT DOCUMENTS

| | | | |
|---|---|---|---|
| 6,177,850 B1* | 1/2001 | Furutani | H03H 7/0123 333/185 |
| 6,472,953 B1* | 10/2002 | Sakuragawa | H03H 9/6483 333/133 |
| 2004/0036558 A1 | 2/2004 | Allison et al. | |
| 2006/0273869 A1* | 12/2006 | Jachowski | 333/204 |

FOREIGN PATENT DOCUMENTS

| | | |
|---|---|---|
| JP | 63-26001 A | 2/1988 |
| JP | 2011244187 A | 12/2011 |

OTHER PUBLICATIONS

Search Report Dated October 19, 2011.

Cheng, "Noise Performance of Negative-Resistance Compensated Microwave Bandpass Filters—Theory and Experiments", IEEE Transactions on Microwave Theory and Techniques, vol. 49, No. 5, May 2001, pp. 924-927.

Chun et al., "Design of an RF Low-Noise Bandpass Filter Using Active Capacitance Circuit", IEEE Transactions on Microwave Theory and Techniques, vol. 53, No. 2, Feb. 2005, pp. 687-695.

Dardillac et al., "Highly selective planar filter using negative resistances for loss compensation", 33rd European Microwave Conference—Munich 2003, pp. 821-824.

Jung et al., "A Wide-Band RF Front-End with Linear Active Notch Filter for Mobile TV Applications", 2010 IEEE Radio Frequency Integrated Circuits Symposium, 978-1-4244-6241-4/978-1-4244-6242-1/978-1-4244-6243-8/10/$26.00, IEEE Copyright 2010, pp. 135-138.

Kim et al., "A Multi-standard Multi-band Tuner for Mobile TV SoC with GSM Interoperability", 2010 IEEE Radio Frequency Integrated Circuits Symposium, 978-1-4244-6241-4/978-1-4244-6242-1/978-1-4244-6243-8/10/$26.00, IEEE Copyright 2010, pp. 189-192.

Lababidi et al., "Tunable Semi-Lumped Dual Response Filter Using Active Capacitor Circuit For Multistandard Systems", Proceedings of the 40th European Microwave Conference, Paris, France, Sep. 28-30, 2010, pp. 838-841.

Park et al., "Low Voltage Tunable Narrow Bandpass Filter using Cross-Coupled Stepped-Impedance Resonator with Active Capacitance Circuit", IMS 2009, 978-1-4244-2804-5/09/$25.00, IEEE Copyright 2009, pp. 1049-1052.

* cited by examiner

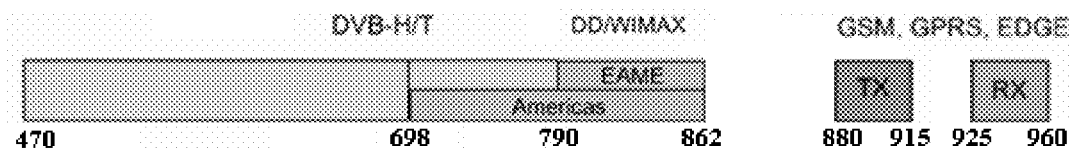
FIG.1 [PRIOR ART]
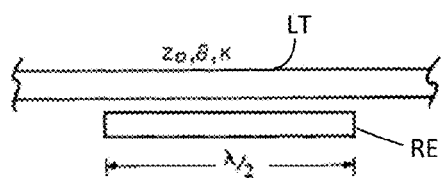
FIG.2 [PRIOR ART]
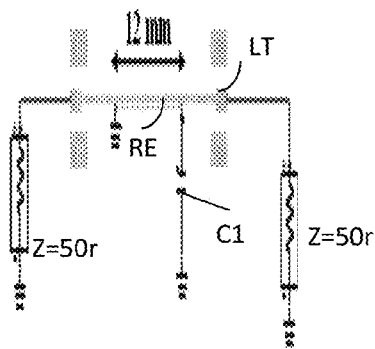
FIG.3 [PRIOR ART]
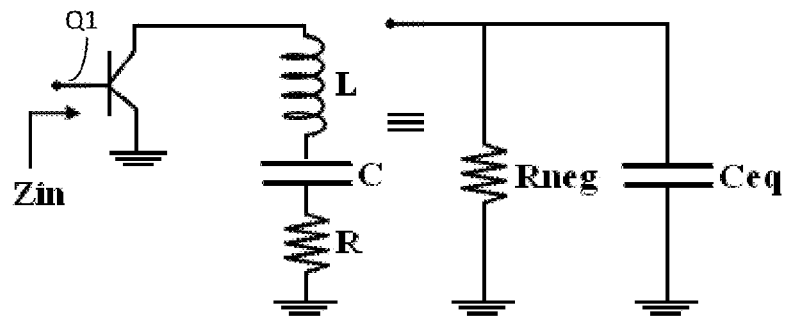
FIG.4

ACTIVE BAND STOP FILTER

This application claims the benefit, under 35 U.S.C, §365 of International Application PCT/EP2011/053684, filed Mar. 11, 2011, which was published in accordance with PCI Article 21(2) on Jun. 21, 2012 in Frence and which claims the benefit of European patent application No. 10195414.7, filed Dec. 16, 2010.

FIELD OF THE INVENTION

The present invention relates to an improvement on the band-rejection filter or active stop band filter. The invention applies to transmission and/or reception systems complying with the DVB-H (Digital Video Broadcasting-Handheld) or DVB-T (Digital Video Broadcasting-Terrestrial) standards.

TECHNOLOGICAL BACKGROUND

More specifically, the invention finds an application in fixed or mobile digital television receivers, complying specifically with the DVB standard, for filtering interfering signals such as, for example, WIMAX signals (Worldwide Interoperability for Microwave Access), present in the frequency band known as digital dividend band.

The digital dividend represents the frequency resources that will be liberated by the passage of television broadcasting from the analog mode to the digital mode. The digital dividend band varies from one region of the world to another and is comprised, for instance, between 698 MHz and 862 MHz for the Americas and 790 MHz and 862 MHz for Europe/Asia as shown in FIG. 1.

These liberated frequency bands will be dedicated to both mobile digital television broadcasting and telecommunications applications. They are particularly sought after by telecommunications operators and broadcasters, due to a superior level of efficiency with respect to frequencies higher than 1 GHz, in terms of coverage and penetration of buildings, and in terms of very much lower costs for the creation and operation of networks. They can, for instance, be used for transmitting new signals such as WIMAX signals. These new signals then constitute an interference source for the reception of DVB signals. Moreover, when the DVB receiver and the WIMAX transmitter are present in a same terminal (multimode and multistandard terminal), the WIMAX signals can saturate the DVB receiver. It is therefore deemed necessary to filter these interfering signals before processing the DVB signals. The WIMAX signals must be filtered in bands that vary according to region. Nevertheless, it is known that the signal must be attenuated in a 10 MHz wide band and that the WIMAX signal must be rejected by 42 dB. There thus exists certain cases when the WIMAX transmitter will not be present and where a filter will not be useful.

The filtering of these interfering signals can be achieved using an appropriate band-rejection or stop band filter. It is thus known in the art to use a half-wave in-line resonator filter such as shown in FIG. 2, which is dimensioned to resonate at a high frequency, well above the useful frequency. The filter of FIG. 2 comprises a transmission line LT (Zo, Θ, k) to which a λ/2 resonator RE is coupled. At resonance frequency level, the energy from the transmission line is "absorbed" by the resonator, thus creating a theoretically infinite attenuation in a relatively narrow band around the resonance frequency. Nevertheless, the disadvantages in using this filter consist in the production of losses that considerably deteriorate the rejection. It is also more cumbersome and difficult to tune on the central frequency. In order to resolve the problem of size, it has been proposed to connect a capacitor C1 to one end of the resonator RE, as shown in FIG. 3. In this case, its equivalent electrical length increases and the frequency of the rejected band decreases. In order for the resonator to reject a particular frequency one must choose the capacitor value suitably. Nevertheless, this capacitor C1 is not ideal, as it has a parasitic resistance Rs that increases when the value of the capacitor increases. This resistance can, under certain conditions, degrade the global quality factor of the loaded line. This is all the more critical since, in order to assign this type of structure, resorting to varactors which display heavy losses is unavoidable.

In order to solve the above problems, it has been proposed to replace the load capacitor by a negative resistance circuit simulating an active capacitor such as represented in FIG. 4, the left part representing the negative resistance circuit and the right part the parallel equivalent model. On the part of FIG. 4, the negative resistance circuit is constituted of a transistor Q1 having base connected to a resonator RE and collector connected to a serial LCR circuit. As shown on the right side of FIG. 4, this circuit is the equivalent of a resistor Rneg parallel to a capacitor Ceq. This circuit enables easy adjustment of the load capacitor value using a single bias voltage while ensuring the compensation of the filter losses, which ensures a high quality factor. The simulation results are shown in FIG. 5 which gives, as a function of the frequency, the transmission (curve a) and the rejection (curve b) of the filter. These curves show a very high rejection (>42 dB) at the central filter frequency around 700 MHz. The latter can be tuned by a simple adjustment of the bias voltage.

SUMMARY OF THE INVENTION

The present invention proposes a deactivable filter of the type described above. The filter thus obtained can be inserted in series in the receiver channel. When the resonator is loaded by an active capacitor, it can be tuned to the specific frequency to be rejected whatever the region considered and can be deactivated if necessary. It then becomes transparent from a system point of view and does not consume energy.

The purpose of the present invention is thus an active stop band filter comprising a filter input and a filter output which are connected by a transmission one, a resonator coupled to the transmission line and connectable to a load impedance, characterized in that it comprises a means of activation of the filtering function in a chosen operating band.

According to a particular embodiment, the means of activation of the filtering function is achieved by a switch located between one end of the resonator and the load impedance.

On the other hand, the load impedance can be constituted of a capacitor, a varactor diode enabling the tuning of the operating frequency or a negative resistance circuit simulating an active capacitor ensuring, moreover, a compensation for the filter losses.

In the case where the load impedance is a passive capacitor, according to another embodiment, the means of activation of the filtering function is achieved by a PIN diode located between one end of the resonator and the passive capacitor.

In the case where the load impedance is an active capacitor, according to another embodiment, the means of activation of the filtering function is achieved by the transistor supply voltage enabling the active capacitance to be achieved.

BRIEF DESCRIPTION OF THE DRAWINGS

Other characteristics and advantages of the present invention will emerge on reading the description of different nonrestrictive embodiments, this description being made with reference to the annexed drawings wherein:

FIG. 1 already described shows the frequency bands of the digital dividend according to region.

FIG. 2 already described schematically shows an embodiment of a stop band filter to which the invention can be applied.

FIG. 3 already described shows the drawing of the stop band filter from FIG. 2 equipped with a load capacitor.

FIG. 4 shows the circuit diagram and the equivalent diagram for an active capacitor.

DETAILED DESCRIPTION OF SEVERAL EMBODIMENTS

To simplify the description, the same elements have the same references in the figures.

Figures 6, 9:
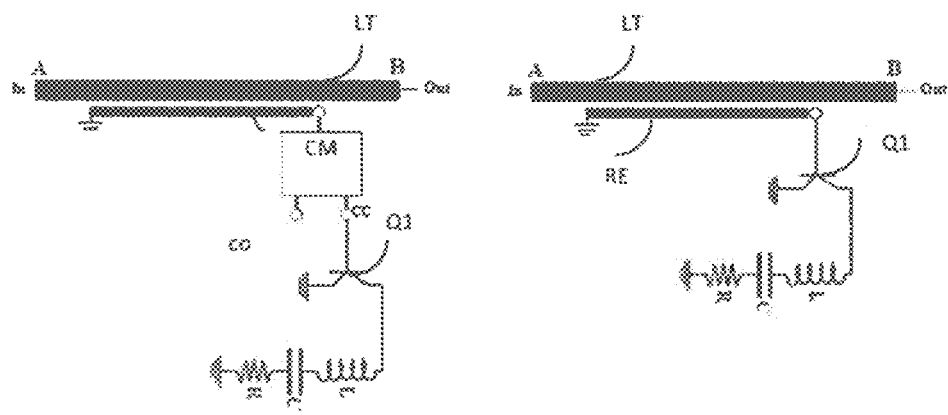
FIG. 6 shows a stop band filter in accordance with the present invention according to a first embodiment.
FIG. 9 shows another embodiment of a stop band filter in accordance with the present invention.

As shown in FIG. 6, the stop band filter or rejection band filter, is constituted by a transmission line LT with an input A and an output B. A resonator RE is coupled with the transmission line LT. This is a line section with a length less than $\lambda/2$, $\lambda$ representing the wavelength guided to the filter rejection frequency.

One of the ends of the resonator is connected to the ground. The other end is connected to the means of activation of the filtering function formed according to the embodiment shown, by a switch CM that can commute between a short circuit terminal (CC) connected to a load impedance and a non-connected open circuit terminal (CO). In the embodiment shown, the load impedance is made up of a negative resistance circuit simulating an active capacitor such as the circuit of FIG. 4.

The negative resistance circuit is an active component well-known to those skilled in the art and whose diagram is shown in FIG. 4. It comprises a bipolar transistor Q1 whose base is connected to the resonator RE, whose transmitter is linked to the ground and whose collector is connected to a load circuit formed of an inductor L, a capacitor C and a resistor R connected in series to the ground. Transistor Q1 is polarized by means known per se (not shown).

This diagram is equivalent to a negative resistor Rneg mounted in parallel to an equivalent capacitor Ceq. The equivalent diagram is shown on the left side of FIG. 4.

Figure 7:
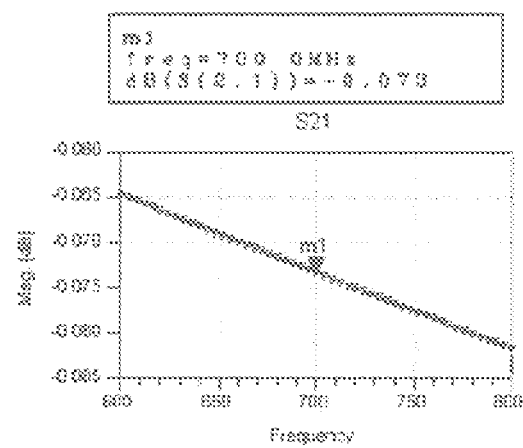
FIG. 7 shows the response of the filter from figure $ when the switch is in open circuit mode.

A description will now be given of the operation of the filter, depending on the position of the switch:

If the switch is in position CO, the resonator is in open circuit mode. Le stop band filter whose intrinsic length is only 12 mm in the chosen embodiment, thus resonates with a frequency range around 3.5 GHz. In the UHF band, the response of the filter is completely transparent. The filter thus acts as a transmission line with hardly any losses as a result of its small physical length as shown in FIG. 7. This position is used when there is no interfering element.

Figure 5:
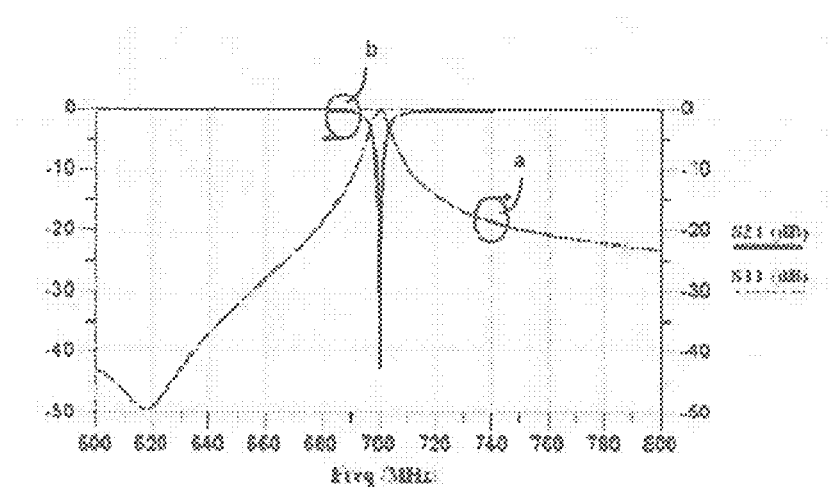
FIG. 5 shows the transmission and rejection curves obtained by simulating the stop band filter of FIG. 2 loaded by an active capacitor.

If the switch is connected to the active capacitor circuit, position CC, it brings the resonance of the stop band filter back towards the UHF band at the frequency to be rejected. One can therefore imagine that the DVB-H demodulator to which the filter is connected could manage the sending of the necessary control voltages to the active stop band filter depending on the frequency of the detected interfering channel. In this position, the filter operates like the circuit in FIGS. 3 and 4, and transmission curves (a) and rejection curves (b) similar to the curves in FIG. 5 are obtained.

We will now describe with reference to FIG. 9, another embodiment of the means of activation of the filtering function in the chosen operating band. This embodiment applies when the load circuit is an active capacitor as represented by transistor CH to which inductor L, capacitor C and resistor R are connected in series. In that case, the means of activation of the filtering function is achieved by directly connecting the transistor base Q1 to one end of the resonator RE and by using the supply voltage of the active capacitor.

When the supply voltage is equal to the polarization voltage Vb of the active capacitor (around 2V for the given example), the tunable rejection filter function (the rejection frequency is determined by the exact value of Vb) is activated. When tension Vb=O (non polarized active circuit), the active device is equivalent to an open circuit and the filtering function is not activated.

Figures 10, 11:
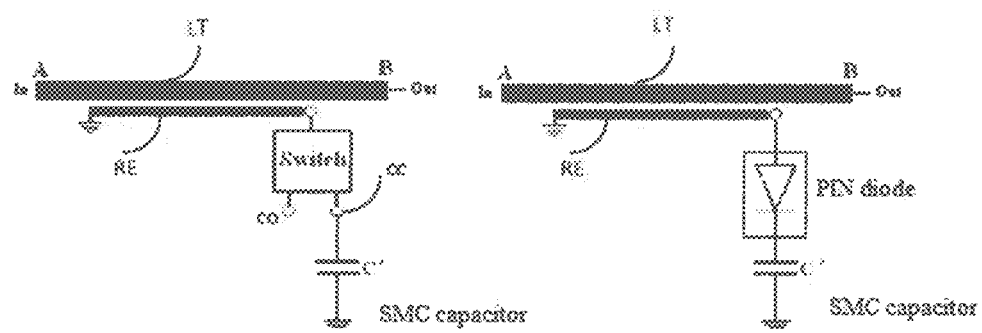
FIG. 10 shows yet another embodiment of a stop band filter in accordance with the present invention and FIG. 11 shows another variant embodiment of a stop band filter in accordance with the present invention.

Another embodiment will be described with reference to FIG. 10. In this case, the stop band filter is connected to a passive capacitor C' and the means of activation of the filtering function is constituted by a switch which can switch between an unconnected CO terminal and a CC terminal connected to the passive capacitor. The operation of this circuit is identical to the operation of the switch in FIG. 6.

Yet another embodiment will be described with reference to FIG. 11. The stop band filter is, in this case, connected to a passive capacitor by a PIN diode located between one end of the resonator and the passive capacitor. When the PIN diode is in the "ON" state, it is equivalent to a short-circuit and the resonator is therefore connected to the load capacitor and the filtering function is activated. When the PIN diode is in the "OFF" state, it is equivalent to an open circuit and the filtering function is not activated.

The resulting stop band filter is composed of a transmission line to which a miniaturized line is coupled, loaded by an active capacitor, these lines being able to be produced in microstrip technology. The active capacitor uses LC SMC components mounted on a FR4 substrate. A prototype of a filter such as described below has been simulated.

Figure 8:
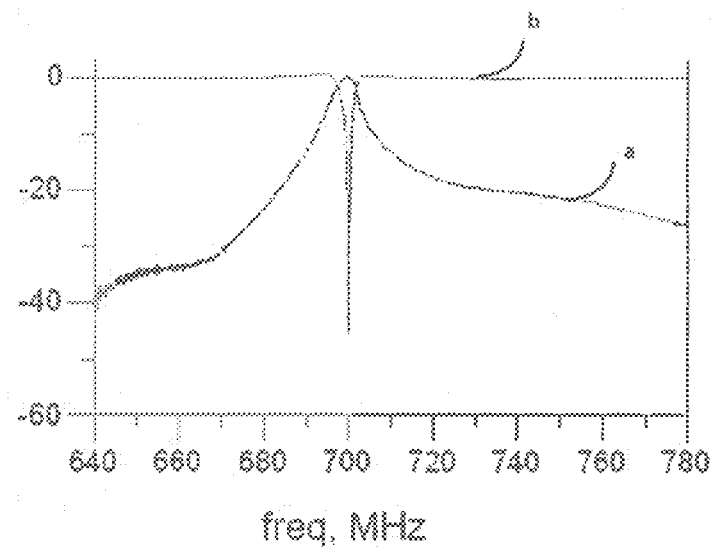
FIG. 8 shows the reflection and transmission response of the filter when the switch is in closed circuit mode.

FIG. 8 shows the transmission and reflection response of the active stop band filter. A rejection of at least 40 dB at 700 MHz may be noted.

Insertion losses when outside the band are low and do not exceed −0.4 dB. The measured noise factor is low and less than 0.5 dB in the bandwidth of the filter. The reflection coefficient at the central frequency of the filter is of the order of −0.1 dB therefore guaranteeing the electrical stability of the circuit.

The invention comprises the following advantages:

A filtering solution enabling, with the use of a low-cost FR4 substrate, strong performance notably in terms of rejection.

The addition of an active capacitor enables the filter to be miniaturized and reconfigured by simply adjusting the voltage. Nevertheless, the invention can also be used with other types of loading circuits.

The addition of an active capacitor has very little impact on the global noise factor of the filter.

The filter enables an automatic response switching by simply activating/deactivating its polarization voltage. The use of filters switched at input and output, which can sometimes be cumbersome and induce non-negligible insertion losses is therefore not necessary.

The invention claimed is:

1. An active stop band filter comprising:
   a filter input and a filter output connected by a transmission line;
   a resonator coupled in parallel to the transmission line and having one end coupled to a ground and another end being connectable to a load impedance; and
   a component arranged between the resonator and the load impedance to activate filtering of a chosen operating band from the transmission line.

2. The active stop band filter according to claim 1, wherein the component is a switch located between one end of the resonator and the load impedance.

3. The active stop band filter according to claim 1, wherein the load impedance is at least one of a capacitor, a varactor diode or a negative resistance circuit simulating an active capacitor.

* * * * *